United States Patent
Ukraintsev et al.

(10) Patent No.: US 9,006,001 B2
(45) Date of Patent: Apr. 14, 2015

(54) SIMPLE SCATTEROMETRY STRUCTURE FOR SI RECESS ETCH CONTROL

(75) Inventors: Vladimir Alexeevich Ukraintsev, Allen, TX (US); Craig Lawrence Hall, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 323 days.

(21) Appl. No.: 12/049,028

(22) Filed: Mar. 14, 2008

(65) Prior Publication Data

US 2009/0159937 A1    Jun. 25, 2009

Related U.S. Application Data

(60) Provisional application No. 61/016,538, filed on Dec. 24, 2007.

(51) Int. Cl.

| H01L 21/66 | (2006.01) |
|---|---|
| H01L 29/78 | (2006.01) |
| H01L 29/165 | (2006.01) |
| H01L 29/66 | (2006.01) |

(52) U.S. Cl.
CPC ......... *H01L 29/7848* (2013.01); *H01L 22/34* (2013.01); *H01L 29/165* (2013.01); *H01L 29/66636* (2013.01); *H01L 29/6656* (2013.01)

(58) Field of Classification Search
CPC ... H01L 22/12; H01L 22/20; H01L 21/67253; H01L 21/68735; H01L 2223/54426
USPC ........... 438/14, 618–637, 195–197, 275, 279
See application file for complete search history.

(56) References Cited

U.S. PATENT DOCUMENTS

| 6,614,540 | B1 * | 9/2003 | Stirton ................... 356/630 |
|---|---|---|---|
| 6,972,853 | B1 * | 12/2005 | Stirton et al. ............... 356/630 |
| 2004/0021866 | A1 * | 2/2004 | Watts et al. ................. 356/401 |
| 2004/0058460 | A1 * | 3/2004 | Bonifield et al. .............. 438/11 |
| 2006/0091108 | A1 * | 5/2006 | Mui et al. ..................... 216/59 |
| 2007/0091327 | A1 * | 4/2007 | Xu et al. ...................... 356/625 |
| 2007/0119373 | A1 * | 5/2007 | Kumar et al. .............. 118/723 I |
| 2008/0248598 | A1 * | 10/2008 | Pal et al. ......................... 438/8 |
| 2009/0059240 | A1 * | 3/2009 | Hartig et al. ................. 356/601 |

* cited by examiner

*Primary Examiner* — H Tsai

(74) *Attorney, Agent, or Firm* — Alan A. R. Cooper; Frank D. Cimino

(57) ABSTRACT

Dimensions of structures in integrated circuits are shrinking with each new fabrication technology generation. Maintaining control of profiles of structures in transistors and interconnects is becoming more important to sustaining profitable integrated circuit production facilities. Measuring profiles of structures with many elements in integrated circuits, such as MOS transistor gates with recessed regions for Si—Ge epitaxial layers, is not cost effective for the commonly used metrology techniques: SEM, TEM and AFM. Scatterometry is technically unfeasible due to the number of elements and optical constants. The instant invention is a simplified scatterometry structure which reproduces the profiles of a structure to be profiled in a simpler structure that is compatible with conventional scatterometric techniques. A method of fabricating a transistor and an integrated circuit using the inventive simplified scatterometry structure are also disclosed.

20 Claims, 7 Drawing Sheets

US 9,006,001 B2

SIMPLE SCATTEROMETRY STRUCTURE FOR SI RECESS ETCH CONTROL

This application claims the benefit of Provisional Application No. 61/016,538, filed Dec. 24, 2007, the entirety of which is hereby incorporated by reference.

FIELD OF THE INVENTION

This invention relates to the field of integrated circuits. More particularly, this invention relates to metrology of advanced MOS structures in integrated circuits.

BACKGROUND OF THE INVENTION

Advanced integrated circuits with MOS transistors commonly have gate and channel structures formed of multiple elements with complicated three-dimensional shapes. For example, transistors with silicon-germanium (Si—Ge) epitaxial elements typically etch silicon in the transistor substrate adjacent to the transistor gates to form trenches for subsequent growth of Si—Ge epitaxial material. Measurement and control of complex three-dimensional structures, such as MOS transistor structures in which source and drain regions have been etched after gate formation in preparation for selective epitaxial growth of germanium containing silicon, in a manufacturing environment is critical to maintaining electrical parameters such as transistor on-state drive currents and off-state leakage currents within specified limits for integrated circuits in high volume production. Commonly used metrology methods for measuring structures in integrated circuits have serious disadvantages for complex three-dimensional structures, for example, structures with undercut features. Top-down Scanning Electron Microscopy (SEM) lacks the resolution to provide detailed profile information. Transmission Electron Microscopy (TEM) is costly, slow and has limited sample size. Atomic Force Microscopy (AFM) profilometry is slow and has limited sample size. Other profilometry techniques are also slow, have limited sample sizes, and typically have insufficient resolution. Scatterometry has difficulty modeling structures with multiple elements such as the multiple gate spacer elements in advanced MOS transistors.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A simplified scatterometry structure is disclosed which includes structures with features equivalent to a target structure in an integrated circuit, and which are simple enough to be profiled using known scatterometric techniques. Profiling etched regions for silicon-germanium epitaxial stress layers adjacent to MOS transistor gates is particularly suited to simplified scatterometry structures. A method of fabricating a transistor and an integrated circuit using the inventive simplified scatterometry structure are also disclosed.

DETAILED DESCRIPTION

Figure 1A:
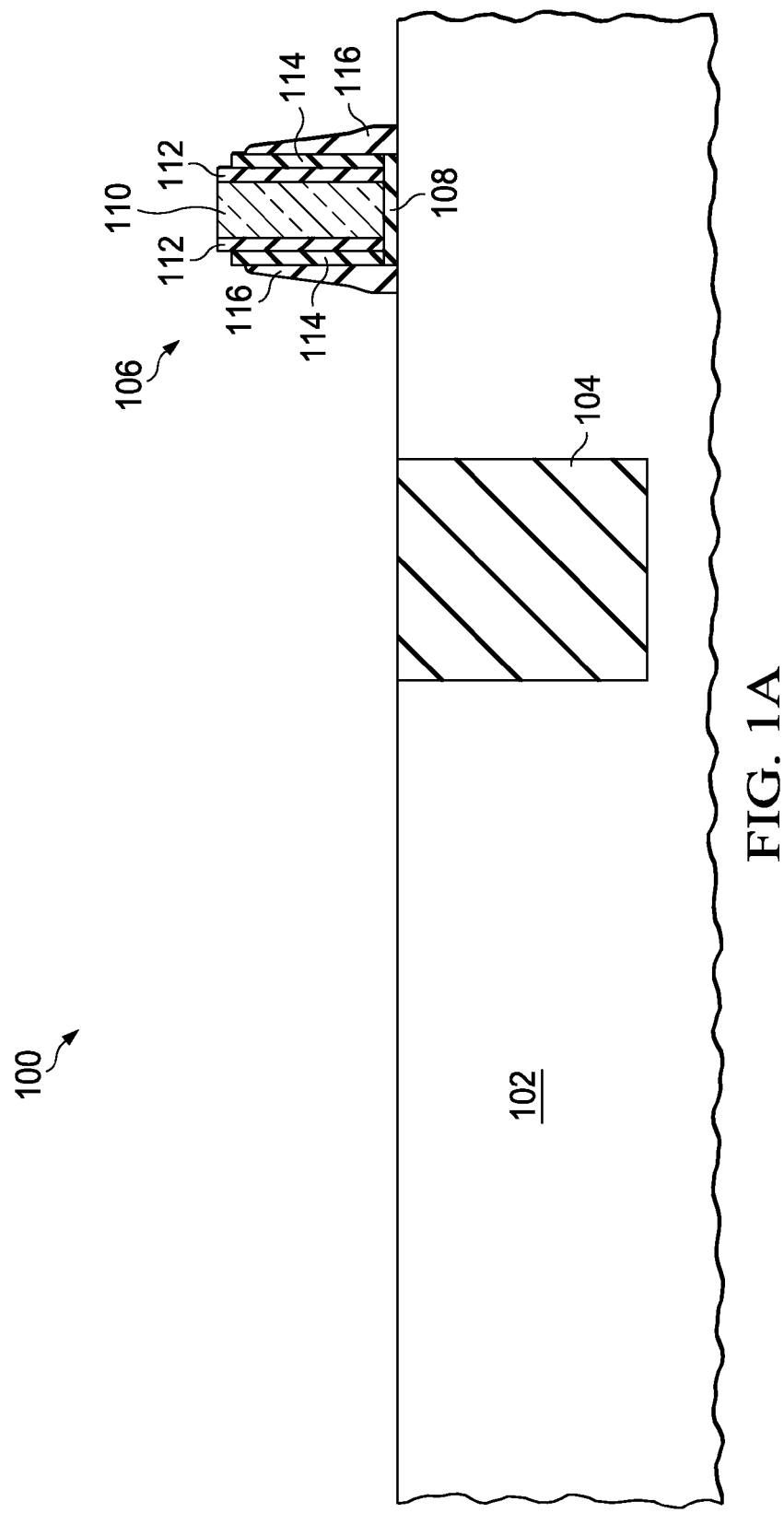
FIG. 1A through FIG. 1F are cross-sections of an integrated circuit during fabrication of a simplified scatterometry structure embodying the instant invention to enable a profile measurement of a etched regions adjacent to an MOS transistor gate structure.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

It is desirable to measure profiles of structures such as MOS transistor gates in integrated circuits during fabrication of the integrated circuits. Moreover, it is desirable to perform the measurement quickly, inexpensively, and non-destructively, in order to minimize the impact of the measurement on workpiece flow in an integrated circuit manufacturing facility. The technique of scatterometry satisfies the requirements of speed, low cost and non-destructiveness, but an accurate scatterometry profile measurement of an arbitrary structure in an integrated circuit is not feasible because scatterometry technique requires a configuration with a plurality of structures to obtain an accurate measurement. A common approach to measuring profiles of structures in integrated circuits by scatterometry is to form replicas of the structure in a scatterometry module, in which a sufficient number of structures are placed to enable an accurate measurement. Accurate measurements by scatterometry require accurate values of dimensions and optical properties such as indices of refraction and absorption coefficients of all elements in the structure to be measured. In the case of etched regions adjacent to MOS transistor gate structures, the number of elements in the MOS transistor gate structures and uncertainty in the values of the optical properties of the elements precludes an accurate profile measurement by conventional scatterometry. The instant invention proceeds by fabricating structures in a scatterometry module which reproduce the features of a structure to be measured, for example, an etched region adjacent to an MOS transistor gate structure, but have significantly fewer elements to the point of enabling an accurate profile measurement by scatterometry. The instant invention is a simplified scatterometry structure, and will be referred to as such in this disclosure.

FIG. 1A through FIG. 1F are cross-sections of an integrated circuit during fabrication of a simplified scatterometry structure embodying the instant invention to enable a profile measurement of etched regions adjacent to an MOS transistor gate structure. FIG. 1A depicts an integrated circuit (100) prior to formation of the simplified scatterometry structure, including a silicon substrate (102), typically p-type silicon, with field oxide (104), typically silicon dioxide formed by shallow trench isolation (STI), occupying regions of a top surface of the silicon substrate (102), to isolate components of the integrated circuit (100). An MOS transistor gate structure (106) is formed on the top surface of the silicon substrate (102); the MOS transistor gate structure (106) includes a gate dielectric (108), typically silicon dioxide, silicon oxy-nitride, hafnium oxide, layers of silicon dioxide and silicon nitride, or other insulating material, a gate electrode (110), typically polycrystalline silicon, and spacer elements (112, 114, 116) typically formed of silicon dioxide, silicon nitride, or other insulating material, by a process sequence of deposition and etch.

Figure 1B:
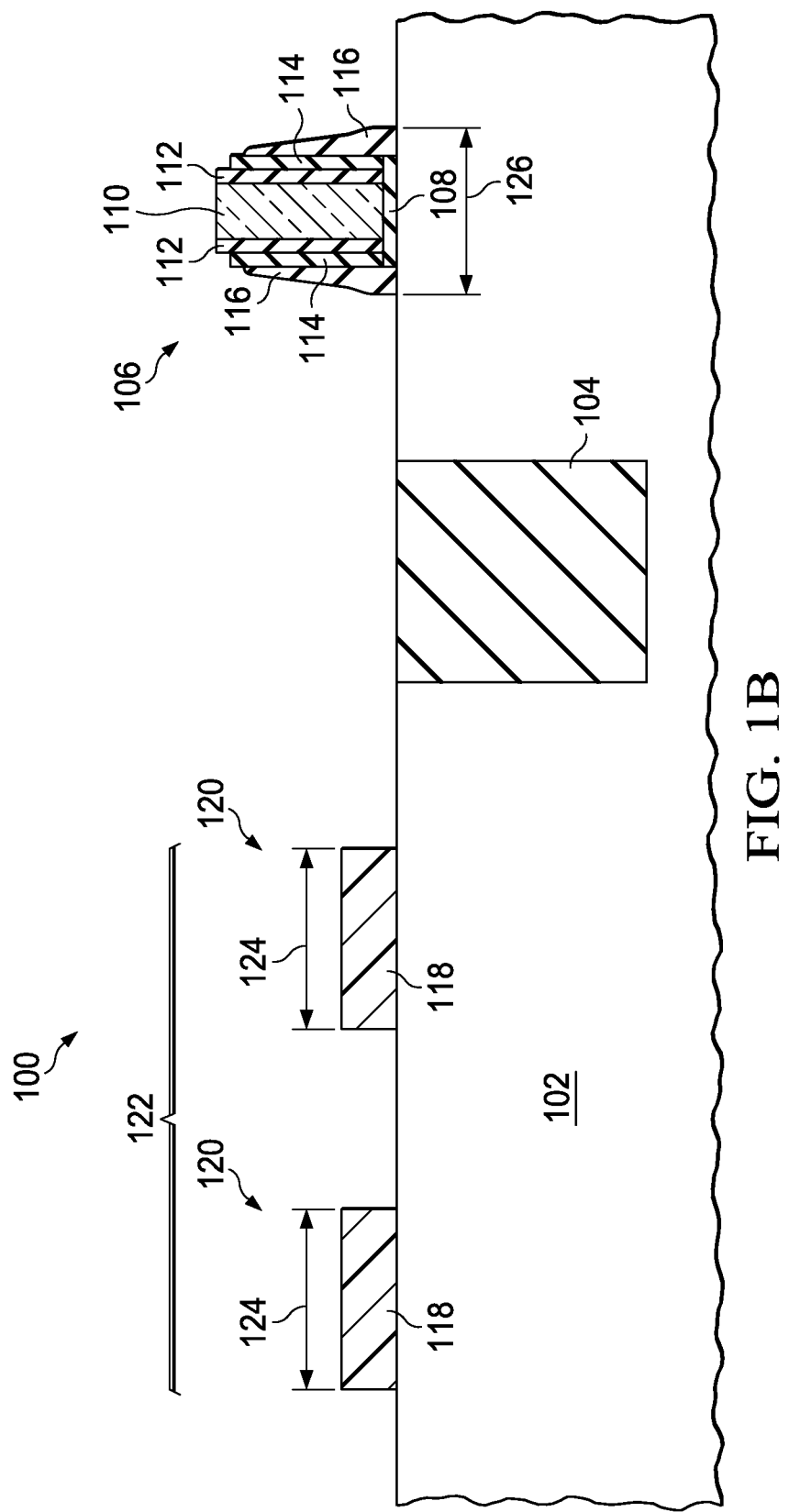

FIG. 1B depicts the integrated circuit (100) after formation of etch blocking elements (118) that define lateral dimensions of simplified scatterometry elements (120) that will form the simplified scatterometry structure (122) according to the instant embodiment. In the instant embodiment, the etch blocking elements (118) are formed of silicon dioxide deposited as an etch blocking layer over other components in the integrated circuit (100). In other embodiments, other materials may be used for the etch blocking elements, such as silicon nitride, polycrystalline silicon and/or photoresist. A blocking element lateral dimension (124) of the etch blocking elements (118) is substantially equal to a gate structure lateral dimension (126) of the MOS transistor gate structure (106). This is advantageous because the process characteristics, such as etch rates, of the simplified scatterometry structure will substantially replicate the process characteristics of the MOS transistors. In a typical scatterometry structure, there are commonly a multitude of subsets of elements, in which elements in each subset are formed at a different lateral dimension, and in which each subset of elements contains a multitude of elements representing the structure to be measured, such as an MOS transistor gate structure. FIG. 1B depicts a small number of elements for clarity.

Figure 1C:
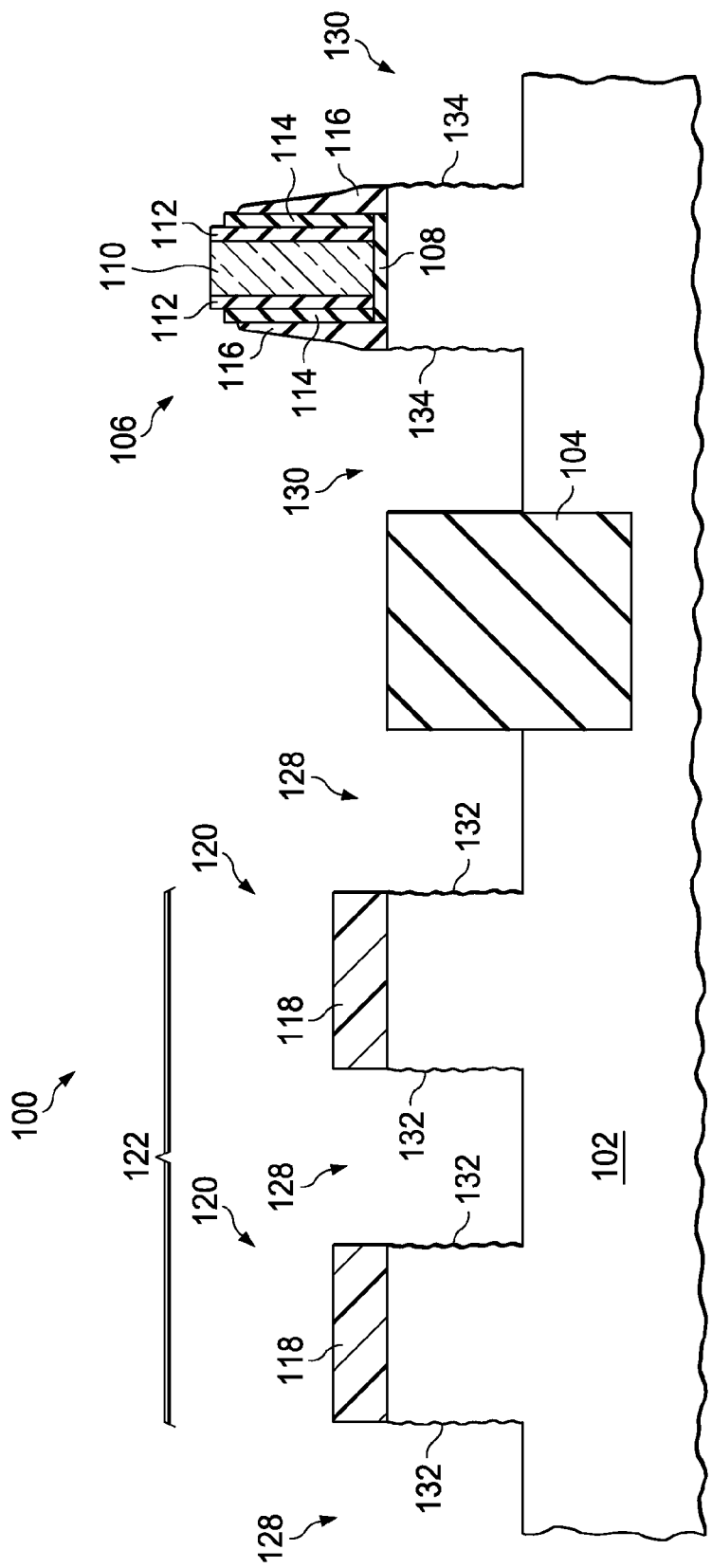

FIG. 1C depicts the integrated circuit (100) after an etch to define regions for Si—Ge epitaxial layer formation. Etched regions (128) in the simplified scatterometry structure (122) are similar to etched regions (130) adjacent to the MOS transistor gate structure (106) in terms of depth of the etched regions (128, 130) and profiles of the sidewalls (132) in the simplified scatterometry structure (122) and sidewalls (134) of the etched regions adjacent to the MOS transistor gate structure (106). This is advantageous because measurements of profiles of sidewalls (132) in etched regions in the simplified scatterometry structure (122) will accurately estimate profiles of sidewalls (134) in etched regions adjacent to MOS transistor gate structures in the integrated circuit (100).

Figure 1D:
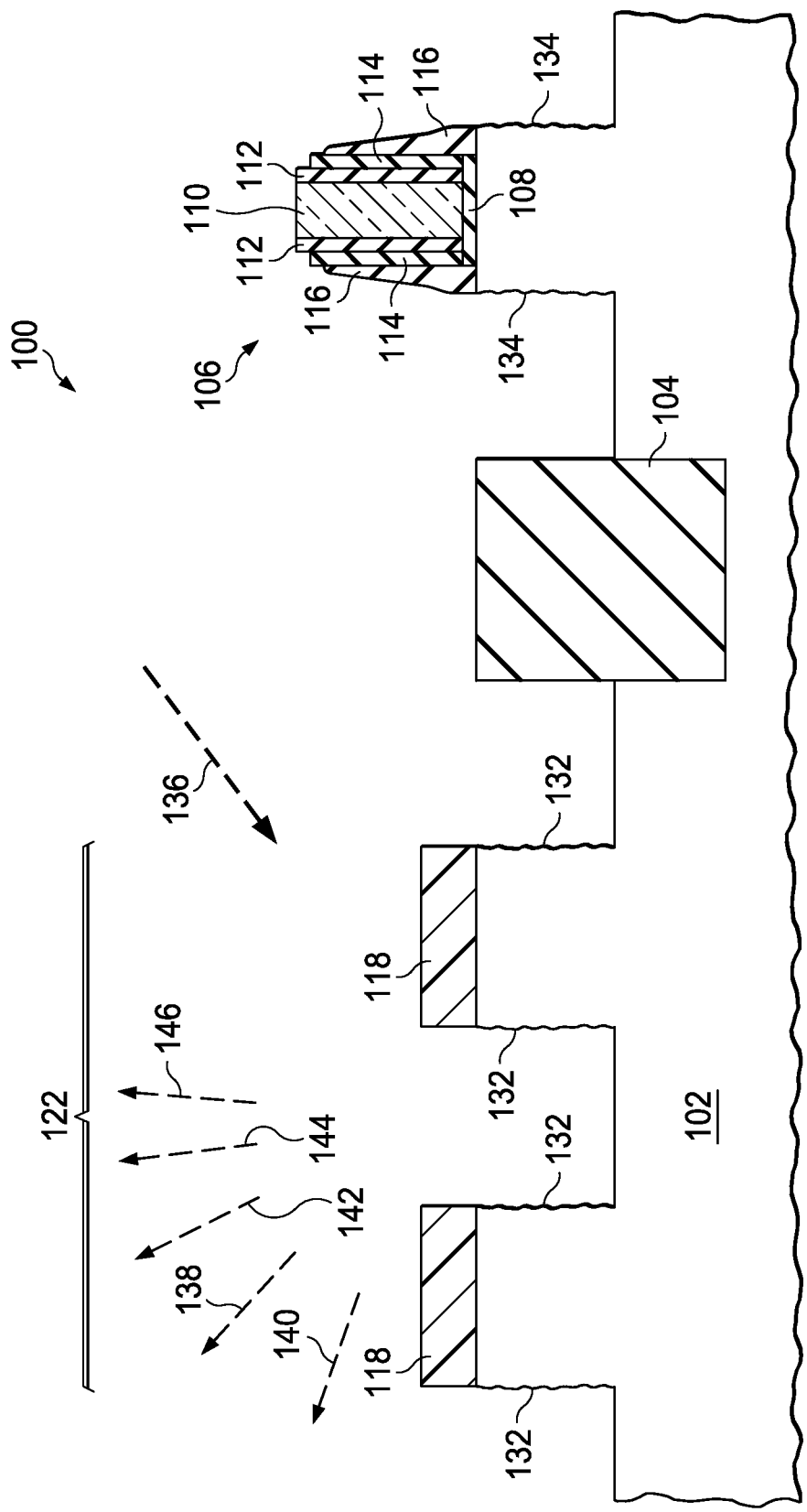

FIG. 1D depicts the integrated circuit (100) during a scatterometry measurement of the simplified scatterometry structure (122). A coherent, monochromatic light beam (136), produced by scatterometry measurement equipment (not shown in FIG. 1D) is incident on the simplified scatterometry structure (122). In some scatterometry measurement equipment, a wavelength of the light beam is varied during a measurement to provide more accurate profile measurements. In some scatterometry measurement equipment, an incident angle of the light beam is varied during a measurement to provide more accurate profile measurements. A zeroth order reflected beam (138) is detected by the scatterometry measurement equipment. A positive first order reflected beam (140), a negative first order reflected beam (142), a negative second order reflected beam (144), and a negative third order reflected beam (146) are also detected by the scatterometry measurement equipment. The scatterometry measurement equipment uses known techniques to compute a profile of the sidewalls (132) in the etched regions of the simplified scatterometry structure (122) embodying the instant invention. The profile computed by the scatterometry measurement equipment is representative of the profile of the sidewalls (134) in the etched regions adjacent to the MOS transistor gate structure (106). This is advantageous because knowledge of the profile of etched regions adjacent to MOS transistor gate structures enables better integrated circuit fabrication control and lower cost integrated circuit manufacturing by adjusting etch process parameters on subsequent integrated circuits to obtain sidewall profiles with desired features.

Figure 1E:
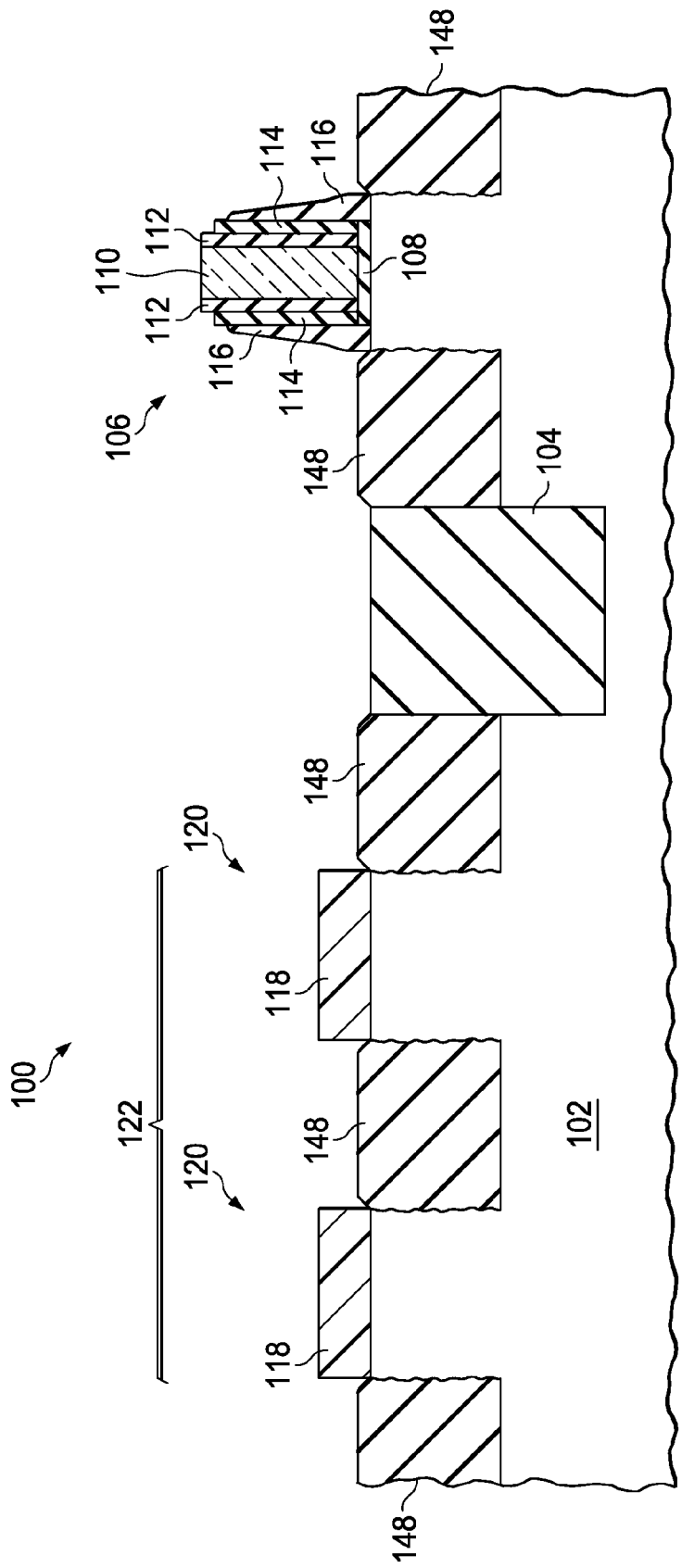

FIG. 1E depicts the integrated circuit (100) after formation of Si—Ge epitaxial layer regions (148) in the etched regions in the substrate (102). The Si—Ge epitaxial layer regions (148) adjacent to the MOS transistor gate structure (106) produce a stress in the silicon in the substrate (102) immediately under the MOS transistor gate structure (106), which affects the on-state drive current of an MOS transistor associated with the MOS transistor gate structure (106). Control of the profile of the etched regions adjacent to MOS transistor gate structure (106) is important in maintaining the desired level of stress produced by the SiGe epitaxial layer regions (148).

Figure 1F:
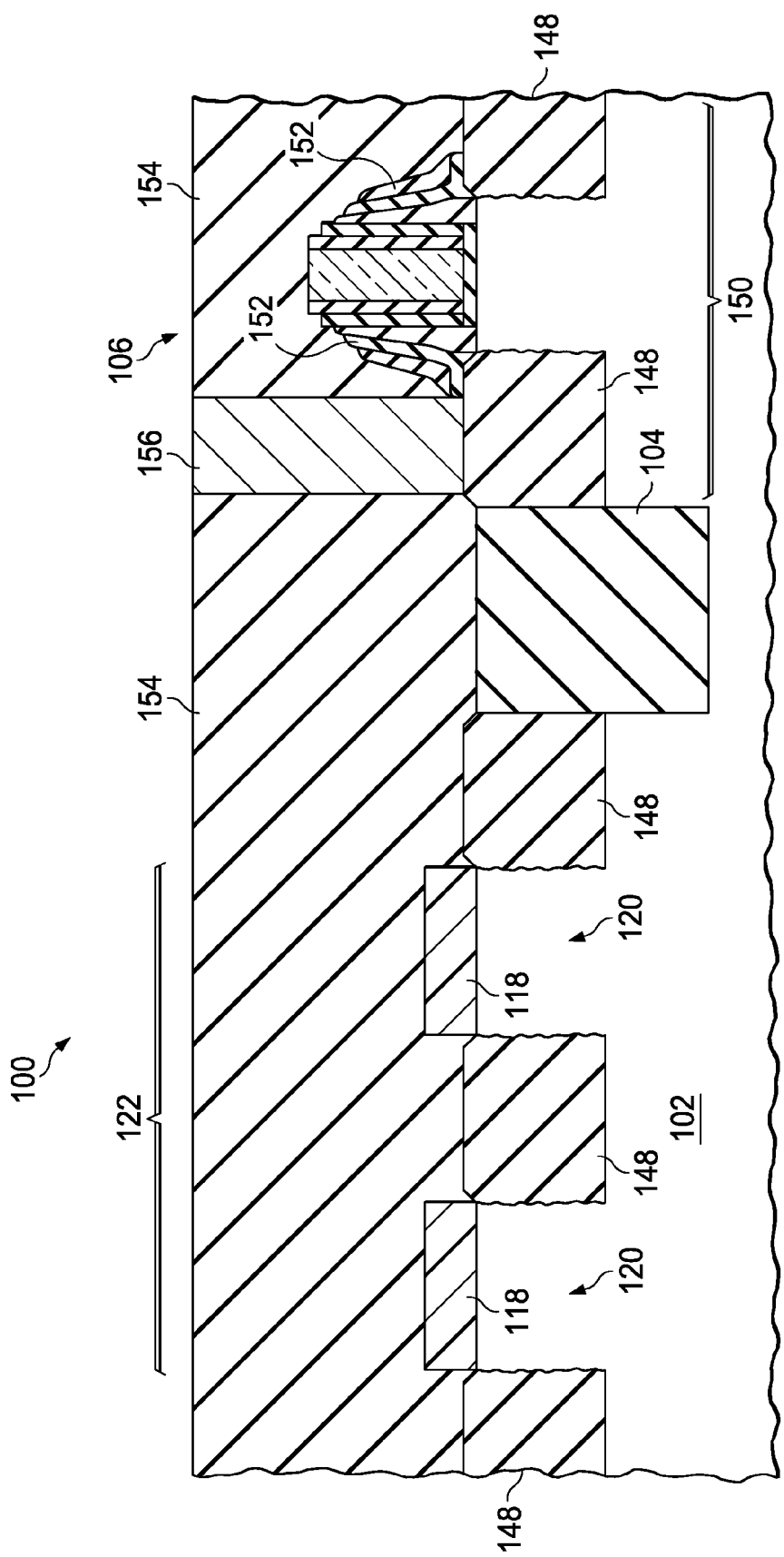

FIG. 1F depicts the integrated circuit (100) after formation of the MOS transistor (148) associated with the MOS transistor gate structure (106) is completed. The MOS transistor (150) includes a gate sidewall spacer (152) on each side of the MOS transistor gate structure (106). An insulating layer (154) known as the pre-metal dielectric (PMD), typically including a thin layer of silicon nitride and a layer of silicon dioxide, is formed on a top surface of the integrated circuit (100). Metal contacts (156), typically tungsten, are formed to connect source and drain regions of the MOS transistor (150) with other components in the integrated circuit (100).

In another embodiment of the instant invention, profiles of structures in interconnect regions of integrated circuits may be estimated by forming simplified structures that reproduce features of interest, such as interconnect trench sidewalls or metal interconnect lines, in a simplified scatterometry structure, and measuring the simplified scatterometry structure using known scatterometric techniques.

In a further embodiment, profiles of structures in microelectromechanical systems (MEMS) devices may be estimated by forming simplified structures that reproduce features of interest, such as cantilever structures, in a simplified scatterometry structure, and measuring the simplified scatterometry structure using known scatterometric techniques.

Figure 2:
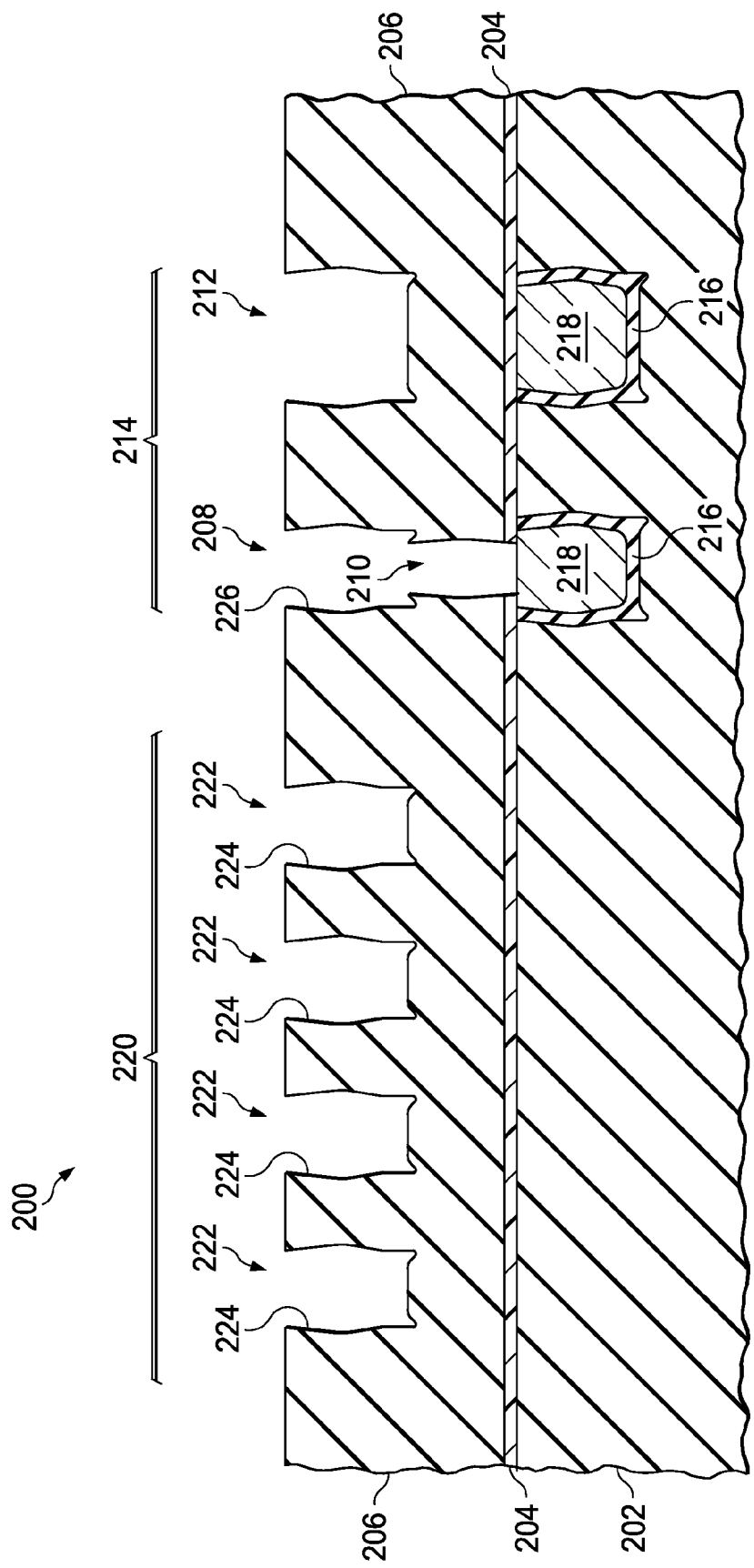
FIG. 2 is a cross-section of an integrated circuit with a simplified scatterometry structure embodying the instant invention to enable a profile measurement of a trench for an interconnect line.

FIG. 2 is a cross-section of an integrated circuit with a simplified scatterometry structure embodying the instant invention to enable a profile measurement of a trench for an interconnect line. Integrated circuit (200) includes a first inter-level dielectric layer (202), an etch stop layer (204) and a second inter-level dielectric layer (206). It is desired to measure a profile of a first trench (208) for an interconnect line. Measurement is hampered by a via hole (210) under the first trench (208), a nearby second trench (212), and underlying metal interconnect lines (214), which include a liner metal (216) and an fill metal (218), typically copper. A simplified scatterometry structure (220) is formed of a set of trenches (222), each of which has a lateral width equal to a lateral width of the first trench (208). A profile of a first sidewall (224) in the simplified scatterometry structure (220) reproduces a profile of a second sidewall (226) in the first trench (208). A scatterometric measurement using known techniques is able to provide a profile measurement of the first sidewall (224), which is representative of the profile of the second sidewall (226) in the first trench (208).

What is claimed is:

1. A method of fabricating an integrated circuit, comprising:
   forming a MOS transistor gate structure over a substrate, the gate structure having a lateral dimension;
   forming an etch blocking element over the substrate, the etch blocking element having a lateral dimension substantially equal to the lateral dimension of the gate structure;
   etching regions of the substrate adjacent to the gate structure to define first etched regions for silicon-germanium epitaxial layer formation
   etching regions of the substrate adjacent to the etch blocking element to define second etched regions similar to the first etched regions in depth and sidewall profile to represent the first region for a scatterometry measurement, wherein the etched regions adjacent the substrate for the scatterometry measurement correspond to at least one element less than a MOS transistor of the MOS transistor gate; and
   performing the scatterometry measurement of sidewalls of the second etched regions, wherein the etched regions adjacent the substrate for the scatterometry measurement correspond to at least one element less than a MOS transistor of the MOS transistor gate; to compute a profile representative of a corresponding profile of sidewalls of the first etched regions.

2. The method of claim 1, wherein the substrate is a silicon substrate, and the method further comprises filling at least the first etched regions with silicon-germanium.

3. The method of claim 1, wherein the etch blocking element is formed from a single layer of etch blocking material.

4. The method of claim 3, wherein the etch blocking material comprises one or more of a silicon oxide, silicon nitride, polycrystalline silicon or photoresist.

5. The method of claim 4, wherein the gate structure comprises a gate dielectric, a gate electrode formed over the gate dielectric, and spacer elements formed on sidewalls of the gate electrode.

6. The method of claim 5, wherein the etch blocking element is a layer of silicon dioxide and the gate electrode is polycrystalline silicon.

7. The method of claim 6, further comprising isolating the etch blocking element and second etched regions from the gate structure and first etched regions by field oxide.

8. A method of fabricating integrated circuits, comprising:
   fabricating a first integrated circuit including:
      forming a MOS transistor gate structure over a silicon substrate, the gate structure having a lateral dimension;
      forming an etch blocking element over the substrate, the etch blocking element having a lateral dimension substantially equal to the lateral dimension of the gate structure;
      using etch process parameters, etching:
         a) regions of the silicon substrate adjacent to the gate structure to define first etched regions for epitaxial layer formation and
         b) regions of the silicon substrate adjacent to the etch blocking element to define second etched regions similar to the first etched regions in depth and sidewall profile to represent the first region for a scatterometry measurement, wherein the etched regions adjacent the substrate for the scatterometry measurement correspond to at least one element less than a MOS transistor;
      performing the scatterometry measurement of sidewalls of the second etched regions wherein the etched regions adjacent the substrate for the scatterometry measurement correspond to at least one element less than a MOS transistor of the MOS transistor gate to compute a profile representative of a corresponding profile of sidewalls of the first etched regions; and
      epitaxially forming a silicon-germanium layer in at least the first etched regions; and
   fabricating a second integrated circuit including:
      forming a second MOS transistor gate structure over a second silicon substrate;
      using adjusted etch process parameters, etching regions of the second silicon substrate adjacent to the second gate structure, the adjusted etch process parameters being based at least in part on the representative profile; and
      epitaxially forming a second silicon-germanium layer in the etched regions of the second silicon substrate.

9. The method of claim 8, wherein the etch blocking element is formed from a single layer of etch blocking material.

10. The method of claim 9, wherein the etch blocking material comprises one or more of a silicon oxide, silicon nitride, polycrystalline silicon or photoresist.

11. The method of claim 10, wherein the gate structure comprises a gate dielectric, a gate electrode formed over the gate dielectric, and spacer elements formed on sidewalls of the gate electrode.

12. The method of claim 11, wherein the etch blocking element is a layer of silicon dioxide and the gate electrode is polycrystalline silicon.

13. The method of claim 12, further comprising isolating the etch blocking element and second etched regions from the gate structure and first etched regions by field oxide.

14. The method of claim 8, wherein performing the scatterometry measurement includes directing a coherent monochromatic light at the etch blocking element and second etched regions; and detecting zeroth order, positive first and second order, and negative first and second order reflections of the light.

15. The method of claim 14, wherein a wavelength of the light is varied.

16. The method of claim 1, further comprising adjusting etch process parameters of subsequent integrated circuits to obtain compensated sidewall profiles on subsequent integrated circuits derived from the scatterometry measurement of sidewalls.

17. The method of claim 16, wherein the compensated sidewall profiles are correlated with at least one desired feature of a stress of an epitaxial layer of the regions adjacent to a gate structure of each of the subsequent integrated.

18. The method of claim 8, further comprising adjusting etch process parameters on subsequent integrated circuits to obtain compensated sidewall profiles on the subsequent integrated circuits derived from the scatterometry measurement of sidewalls.

19. The method of claim 18, wherein the compensated sidewall profiles are correlated with at least one desired feature of a stress of an epitaxial layer of the regions adjacent to a gate structure of each of the subsequent integrated circuits.

20. A method of fabricating an integrated circuit, comprising:
   forming a MOS transistor gate structure over a substrate, the gate structure having a lateral dimension;

forming an etch blocking element over the substrate, the etch blocking element having a lateral dimension substantially equal to the lateral dimension of the gate structure;

etching regions of the substrate adjacent to the gate structure to define first etched regions for epitaxial layer formation;

etching regions of the substrate adjacent to the etch blocking element to define second etched regions similar to the first etched regions in depth and sidewall profile to represent the first region for a scatterometry measurement, wherein the etched regions adjacent the substrate for the scatterometry measurement correspond to at least one element less than a MOS transistor of the MOS transistor gate;

performing the scatterometry measurement of sidewalls of the second etched regions wherein the etched regions adjacent the substrate for the scatterometry measurement correspond to at least one element less than a MOS transistor of the MOS transistor gate, to compute a profile representative of a corresponding profile of sidewalls of the first etched regions, adjusting etch process parameters on subsequent integrated circuits to obtain compensated sidewall profiles on the subsequent integrated circuits derived from the scatterometry measurement of sidewalls, and wherein the compensated sidewall profiles are correlated with at least one desired feature of a stress of an epitaxial layer of the regions adjacent to a gate structure of each of the subsequent integrated circuits, wherein the epitaxial layer comprises silicon-germanium.

* * * * *